(12) United States Patent
Yamamoto

(10) Patent No.: US 9,201,203 B2
(45) Date of Patent: Dec. 1, 2015

(54) PHOTOELECTRIC COMPOSITE SUBSTRATE AND METHOD OF MANUFACTURING THE SAME

(71) Applicant: SHINKO ELECTRIC INDUSTRIES CO., LTD., Nagano-shi, Nagano (JP)

(72) Inventor: Kazunao Yamamoto, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 251 days.

(21) Appl. No.: 13/788,151

(22) Filed: Mar. 7, 2013

(65) Prior Publication Data
US 2013/0236138 A1     Sep. 12, 2013

(30) Foreign Application Priority Data
Mar. 8, 2012   (JP) ................................. 2012-051604

(51) Int. Cl.
| | |
|---|---|
| G02B 6/42 | (2006.01) |
| H05K 1/02 | (2006.01) |
| G02B 6/43 | (2006.01) |
| G02B 6/12 | (2006.01) |
| H01L 21/50 | (2006.01) |
| G02B 6/122 | (2006.01) |
| H05K 1/14 | (2006.01) |
| H05K 1/18 | (2006.01) |

(52) U.S. Cl.
CPC ............ *G02B 6/4283* (2013.01); *G02B 6/4214* (2013.01); *G02B 6/43* (2013.01); *H05K 1/0274* (2013.01); *G02B 6/12* (2013.01); *G02B 6/1221* (2013.01); *G02B 6/428* (2013.01); *H01L 21/50* (2013.01); *H05K 1/141* (2013.01); *H05K 1/181* (2013.01); *H05K 2201/10106* (2013.01); *H05K 2201/10121* (2013.01)

(58) Field of Classification Search
CPC ........................... G02B 6/4283; G02B 6/4214
See application file for complete search history.

(56) References Cited

U.S. PATENT DOCUMENTS

2009/0016671 A1 *   1/2009  Asai et al. ....................... 385/14

FOREIGN PATENT DOCUMENTS

| JP | 2001-007463 | 1/2001 |
|---|---|---|
| JP | 2011-003774 | 1/2011 |

* cited by examiner

*Primary Examiner* — Jerry Rahll
(74) *Attorney, Agent, or Firm* — Rankin, Hill & Clark LLP

(57) ABSTRACT

There is provided a photoelectric composite substrate including: a wiring substrate comprising a first region and a second region; an optical waveguide disposed on the first region of the wiring substrate and including: a first cladding layer on the wiring substrate; a core layer on the first cladding layer; a second cladding layer on the core layer; a wiring layer on the second region of the wiring substrate; and an insulating layer having an opening portion on the wiring layer such that the wiring layer is exposed through the opening portion, wherein the insulating layer is made of the same material as that of the core layer.

16 Claims, 14 Drawing Sheets

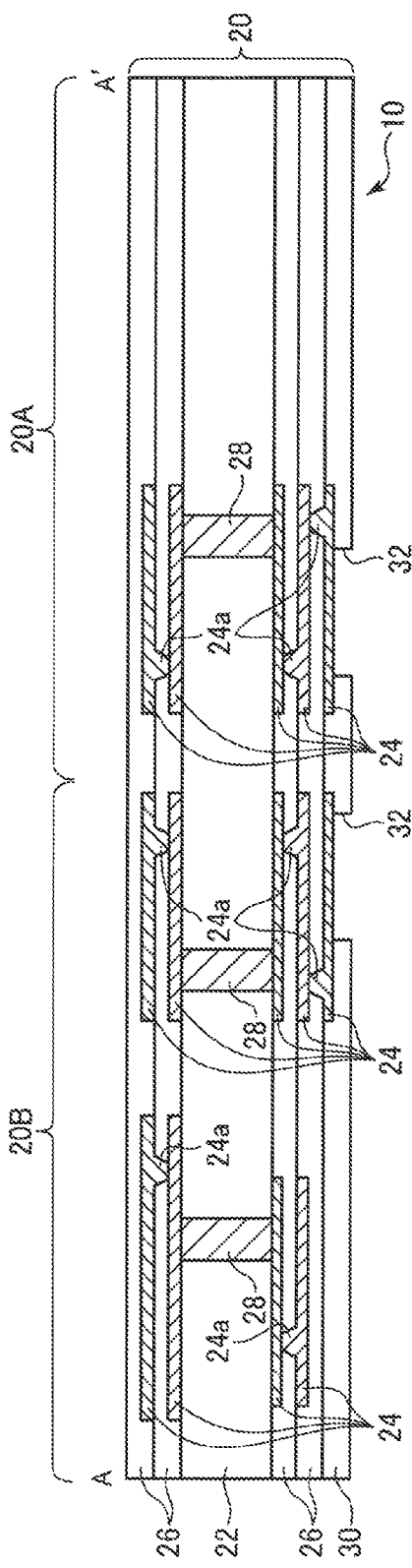
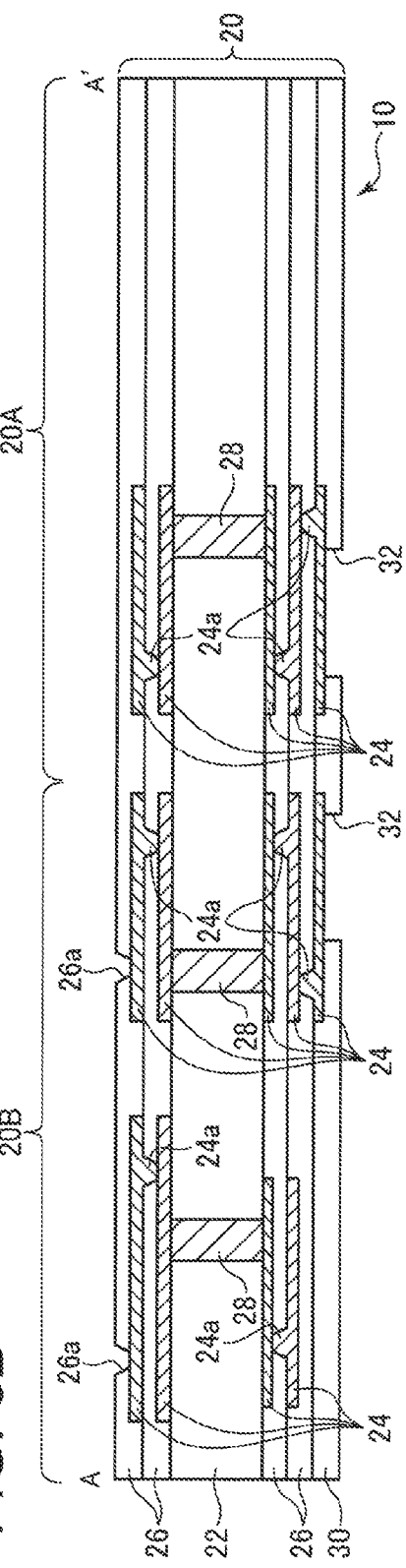
FIG. 5A
FIG. 5B

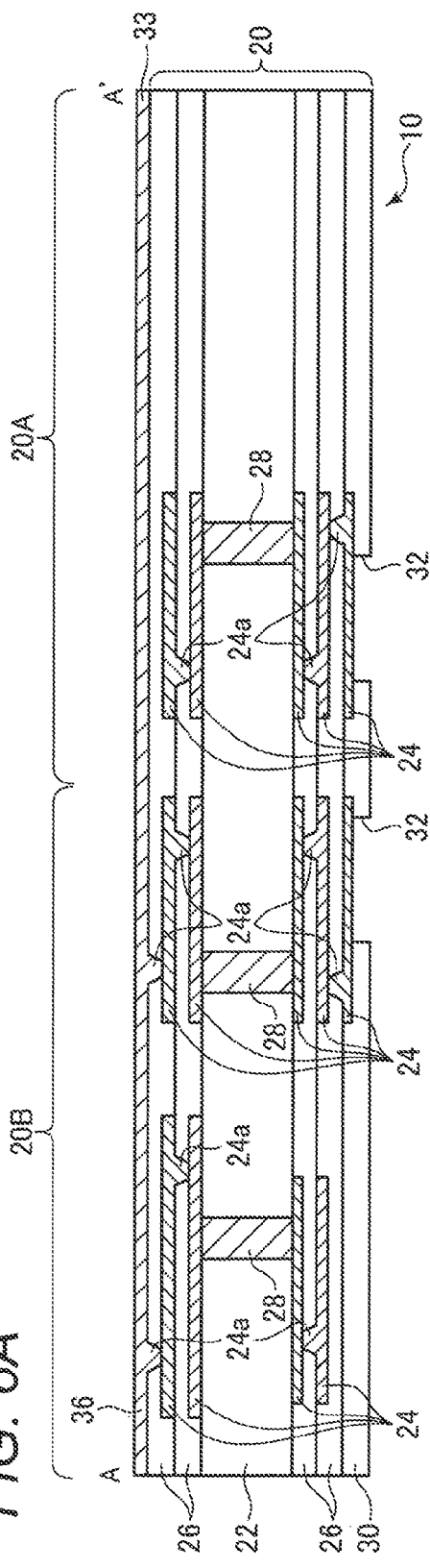
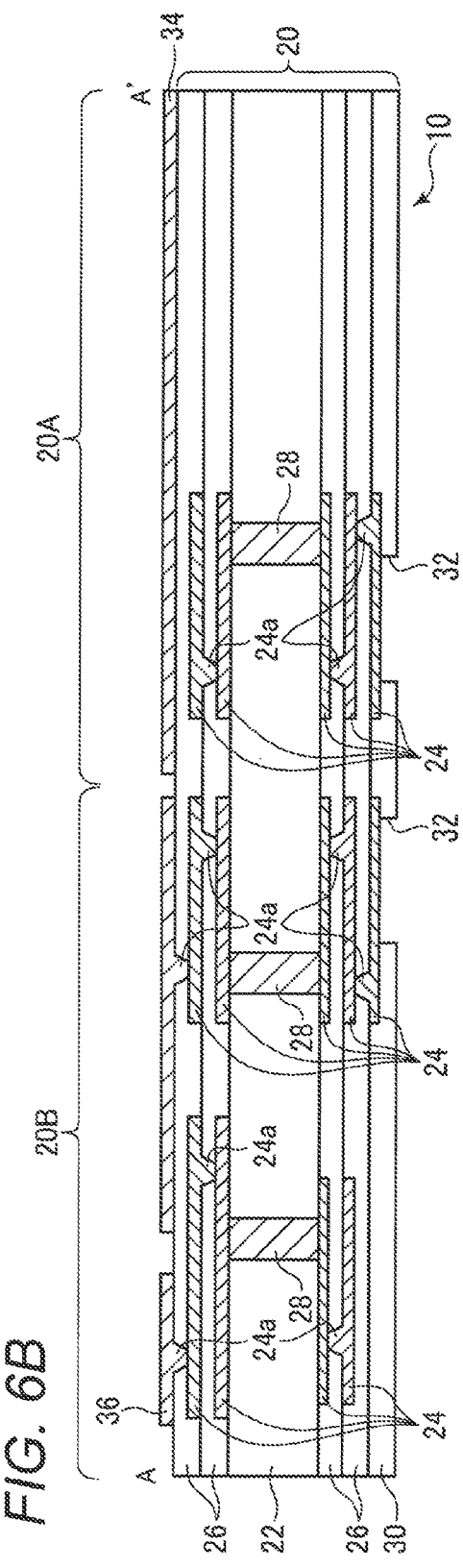

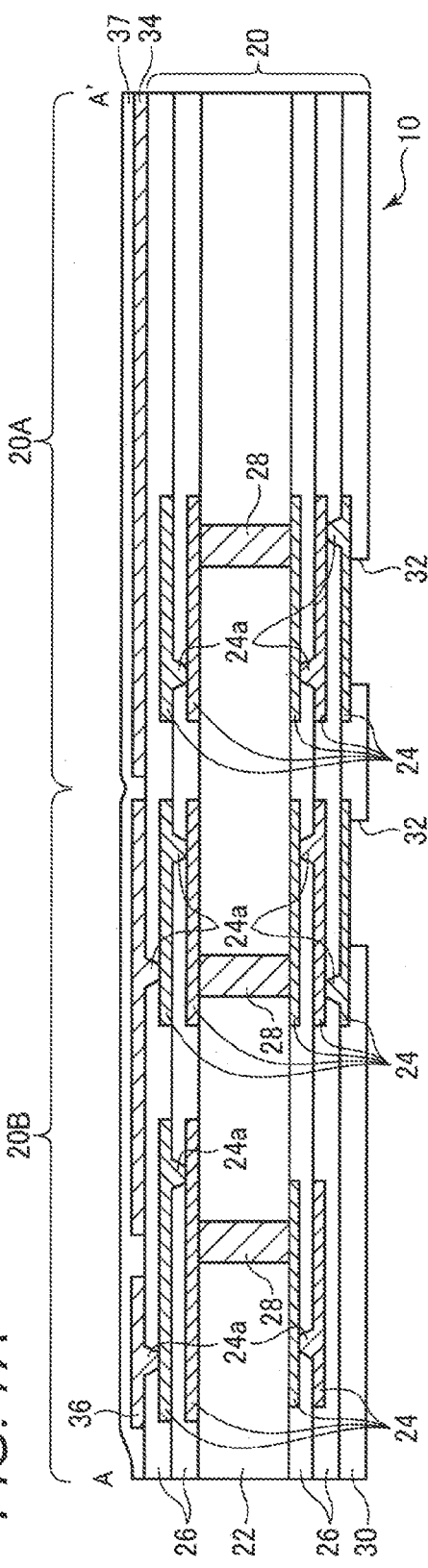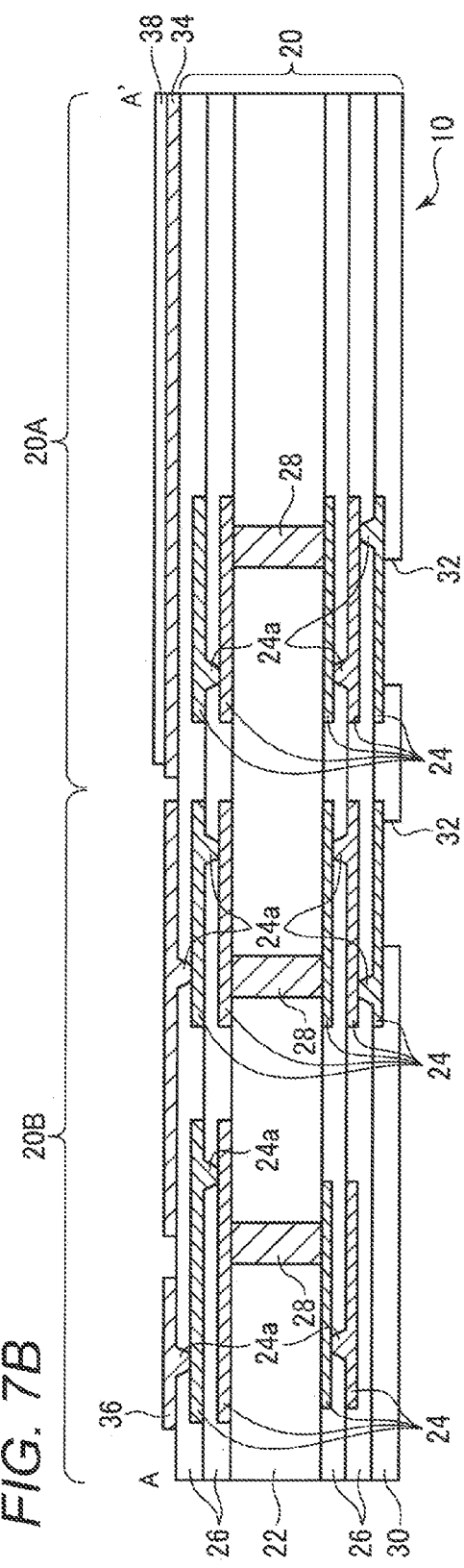

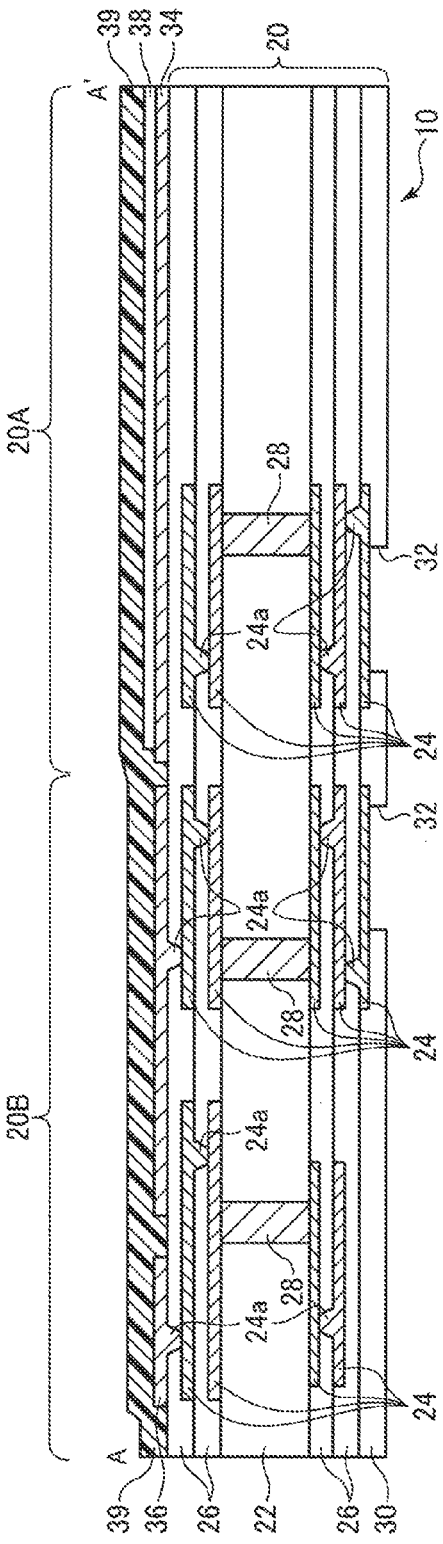
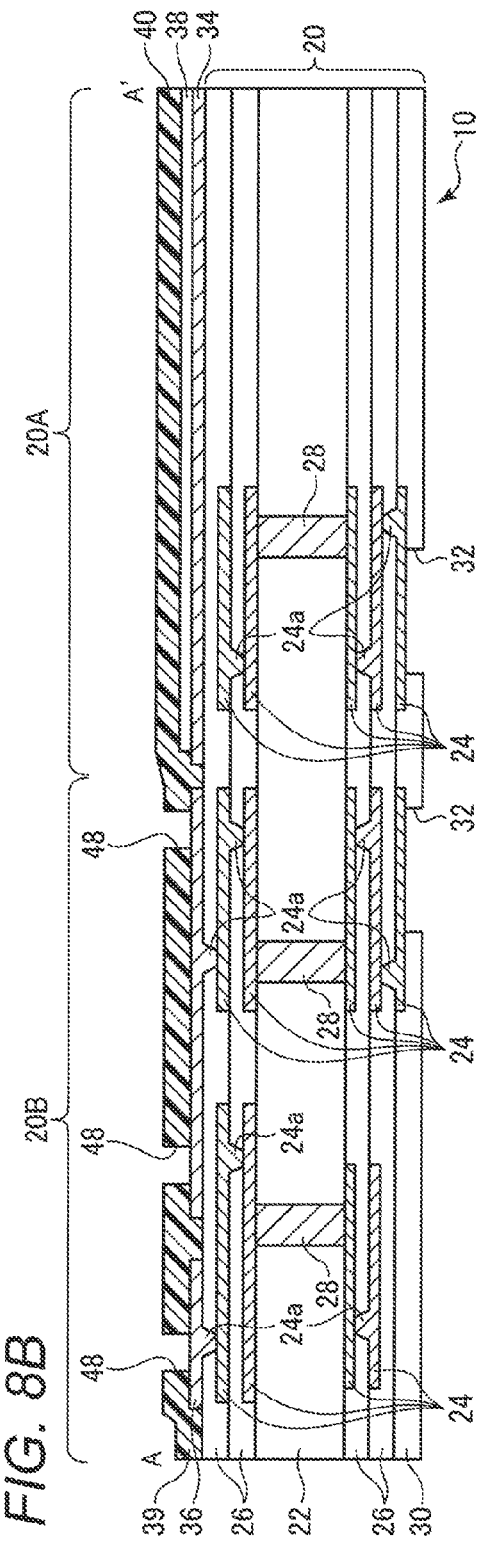
FIG. 8A
FIG. 8B

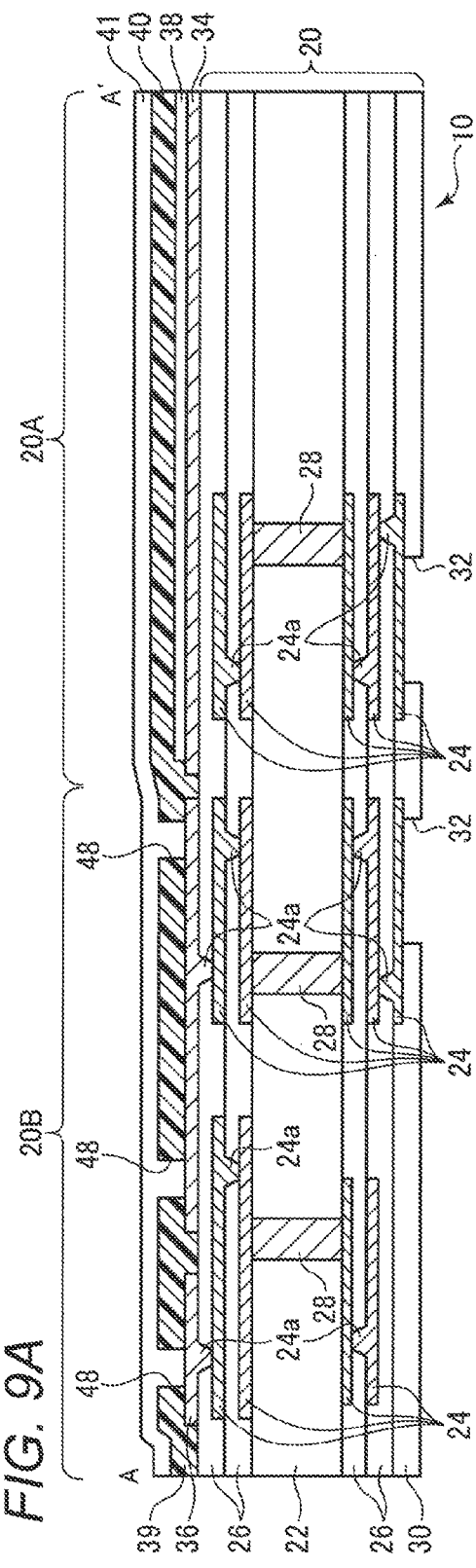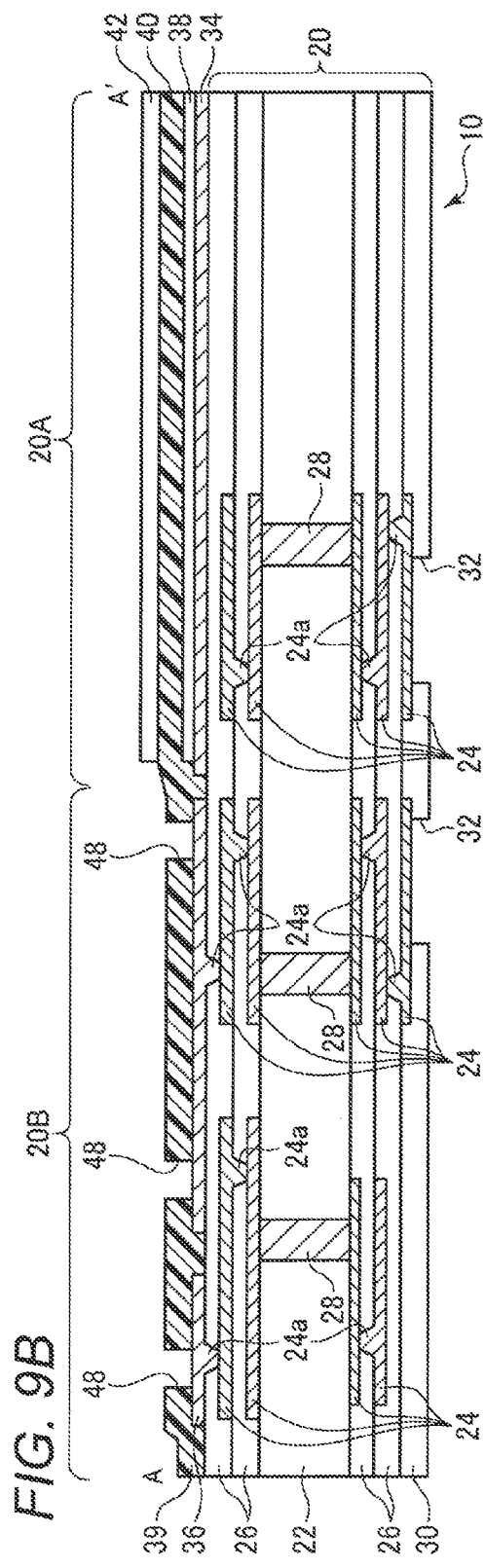

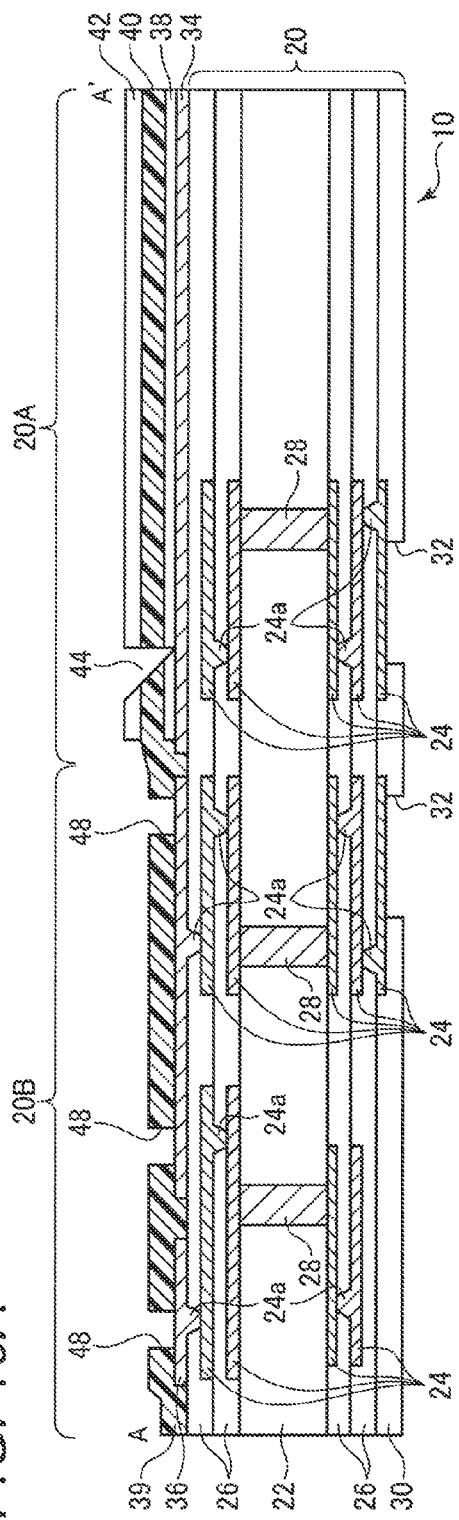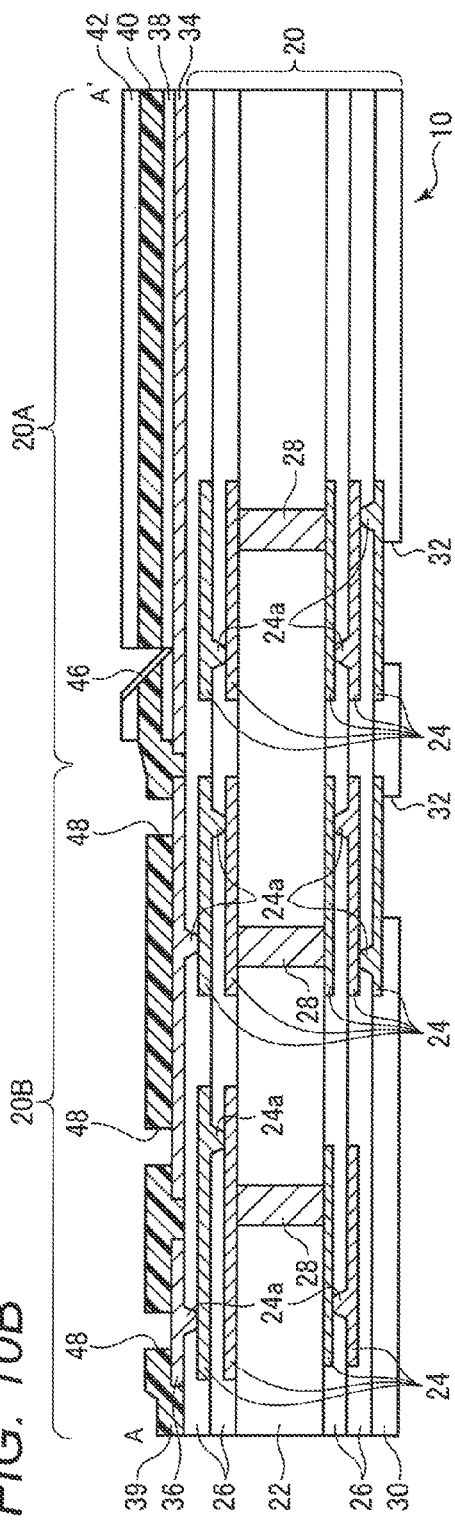

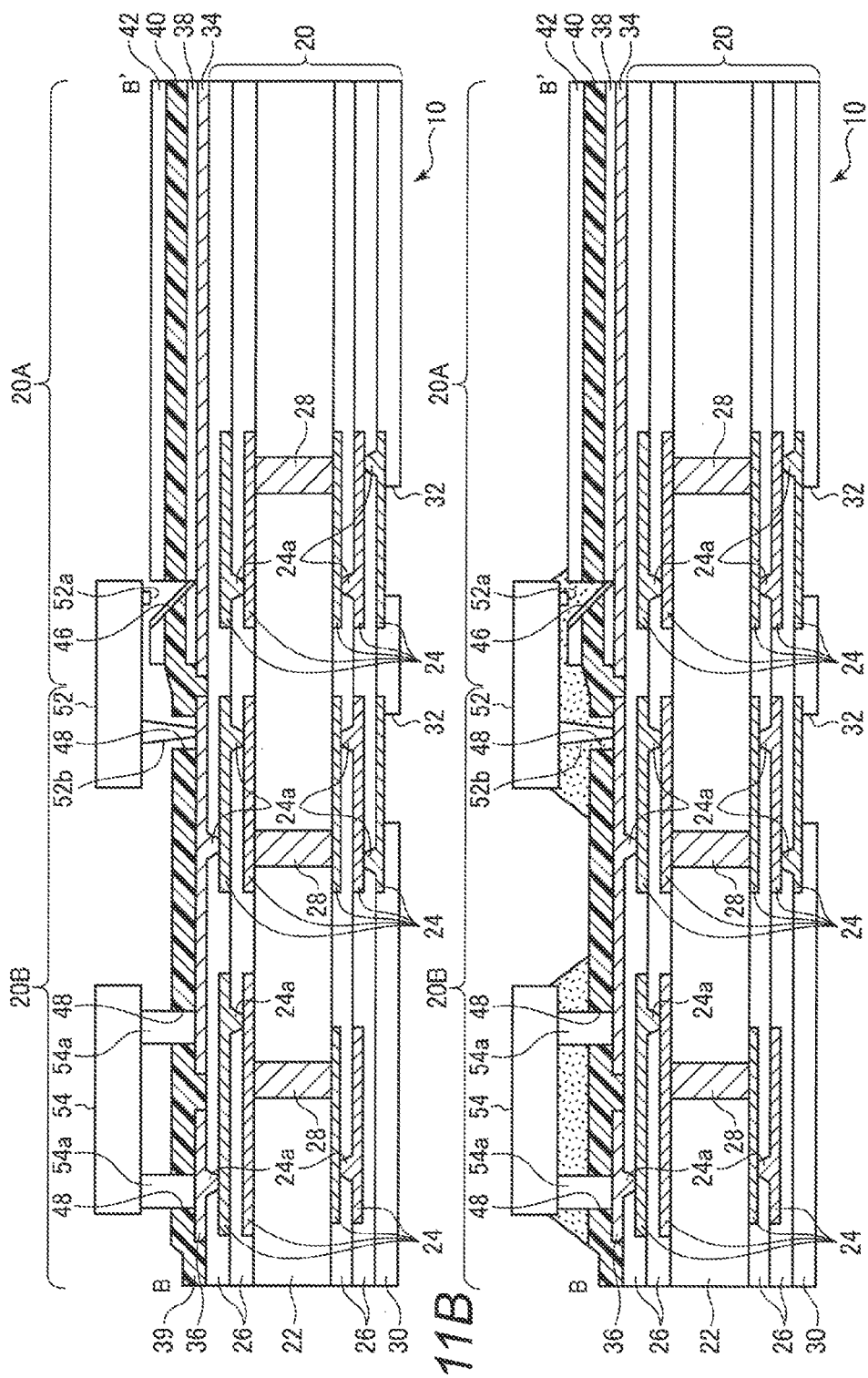

PHOTOELECTRIC COMPOSITE SUBSTRATE AND METHOD OF MANUFACTURING THE SAME

This application claims priority from Japanese Patent Application No. 2012-051604, filed on Mar. 8, 2012, the entire contents of which are herein incorporated by reference.

BACKGROUND

1. Technical Field

The present disclosure relates to a photoelectric composite substrate and a method of manufacturing the same, and more particularly, to a photoelectric composite substrate on which an optical component and an electronic component are mounted and a method of manufacturing the same.

2. Description of the Related Art

In recent years, electric wirings inside information terminals constantly cause bottlenecks with the development of communication lines of a backbone system, for example, an optical fiber communication technology. In this regard, instead of an electric circuit substrate in the related art in which signal transmission is entirely performed by an electric signal, a photoelectric composite substrate has been proposed in which a portion necessary for high-speed communication is transmitted by an optical signal in order to compensate the limit of the transmission speed of the electric signal. On the photoelectric composite substrate, an optical component such as a light receiving device or a light emitting device and an electronic component such as a driver, an amplifier or a control circuit are mounted (see e.g., JP-A-2011-003774 and JP-A-2001-007463).

In order to mount the optical component and the electronic component on one photoelectric composite substrate, strict position accuracy is necessary for opening portions for mounting the components.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

An illustrative aspect of the present invention is to provide a photoelectric composite substrate in which the position of an opening portion for mounting an optical component, an electronic component or the like can be formed with high accuracy, and a method of manufacturing the same.

According to one or more illustrative aspects of the present invention, there is provided a photoelectric composite substrate including: a wiring substrate comprising a first region and a second region; an optical waveguide disposed on the first region of the wiring substrate and including: a first cladding layer on the wiring substrate; a core layer on the first cladding layer; a second cladding layer on the core layer; a wiring layer on the second region of the wiring substrate; and an insulating layer having an opening portion on the wiring layer such that the wiring layer is exposed through the opening portion, wherein the insulating layer is made of the same material as that of the core layer.

According to one or more illustrative aspects of the present invention, there is provided a method of manufacturing a photoelectric composite substrate. The method includes: (a) providing a wiring substrate comprising a first region and a second region; (b) forming a wiring layer on the second region of the wiring substrate; (c) forming a first cladding layer on the first region of the wiring substrate; (d) forming a core layer on the first cladding layer while forming an insulating layer having an opening portion on the wiring layer such that the wiring layer is exposed through the opening portion, wherein the insulating layer is made of the same material as that of the core layer; and (e) forming a second cladding layer on the core layer.

Other aspects and advantages of the present invention will be apparent from the following description, the drawings and the claims.

BRIEF DESCRIPTION OF THE DRAWINGS

FIGS. 5A and 5B are the first process cross-sectional views illustrating a method of manufacturing the photoelectric composite substrate according to the first embodiment;

FIGS. 6A and 6B are the second process cross-sectional views illustrating the method of manufacturing the photoelectric composite substrate according to the first embodiment;

FIGS. 7A and 7B are the third process cross-sectional views illustrating the method of manufacturing the photoelectric composite substrate according to the first embodiment;

FIGS. 8A and 8B are the fourth process cross-sectional views illustrating the method of manufacturing the photoelectric composite substrate according to the first embodiment;

FIGS. 9A and 9B are the fifth process cross-sectional views illustrating the method of manufacturing the photoelectric composite substrate according to the first embodiment;

FIGS. 10A and 10B are the sixth process cross-sectional views illustrating the method of manufacturing the photoelectric composite substrate according to the first embodiment;

FIGS. 11A and 11B are the seventh procedure cross-sectional views illustrating the method of manufacturing the photoelectric composite apparatus according to the first embodiment;

DETAILED DESCRIPTION OF EXEMPLARY EMBODIMENTS

Figure 1:
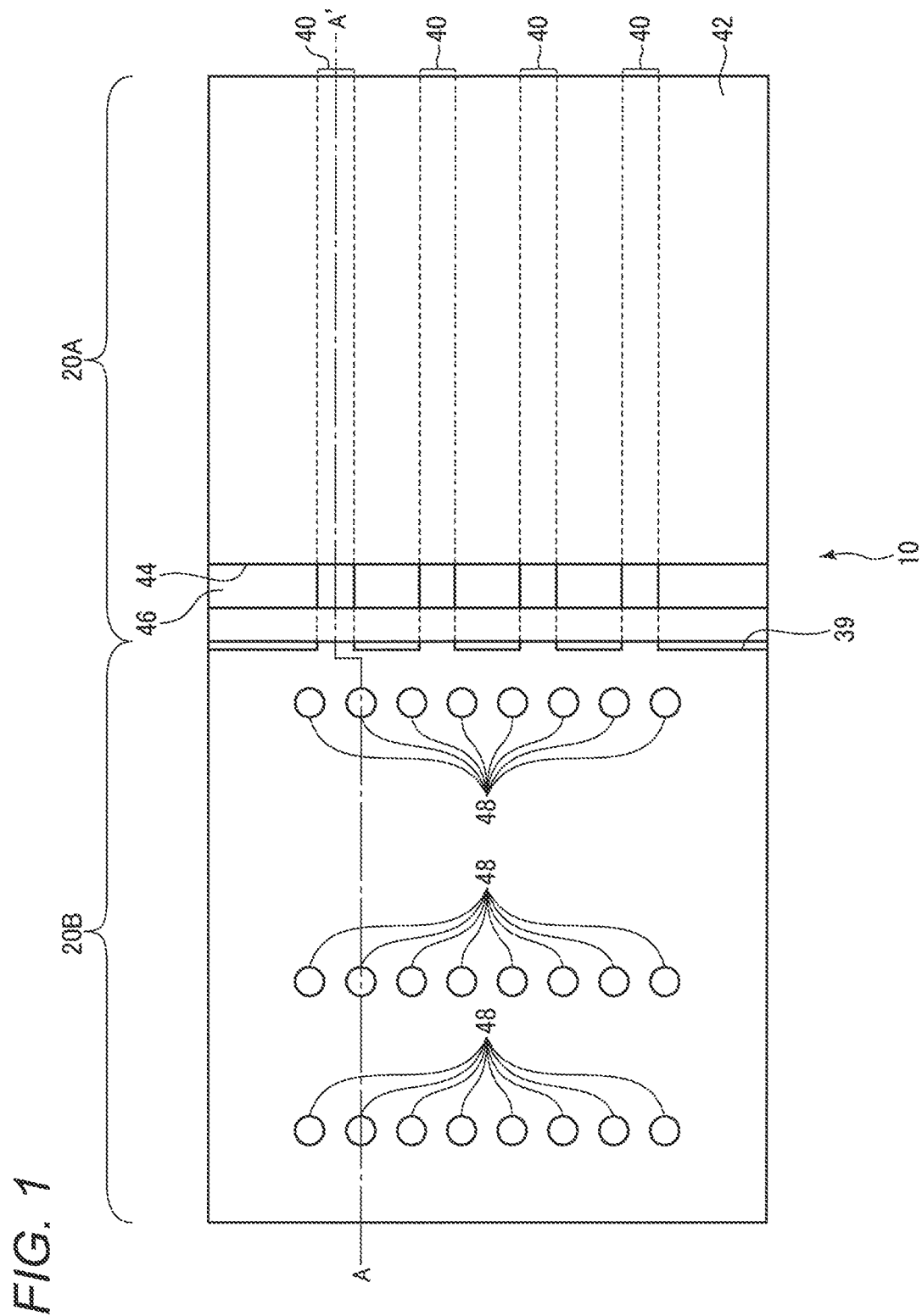
FIG. 1 is a plan view illustrating a photoelectric composite substrate according to a first embodiment of the invention.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

First Embodiment

Photoelectric Composite Substrate

Figure 2:
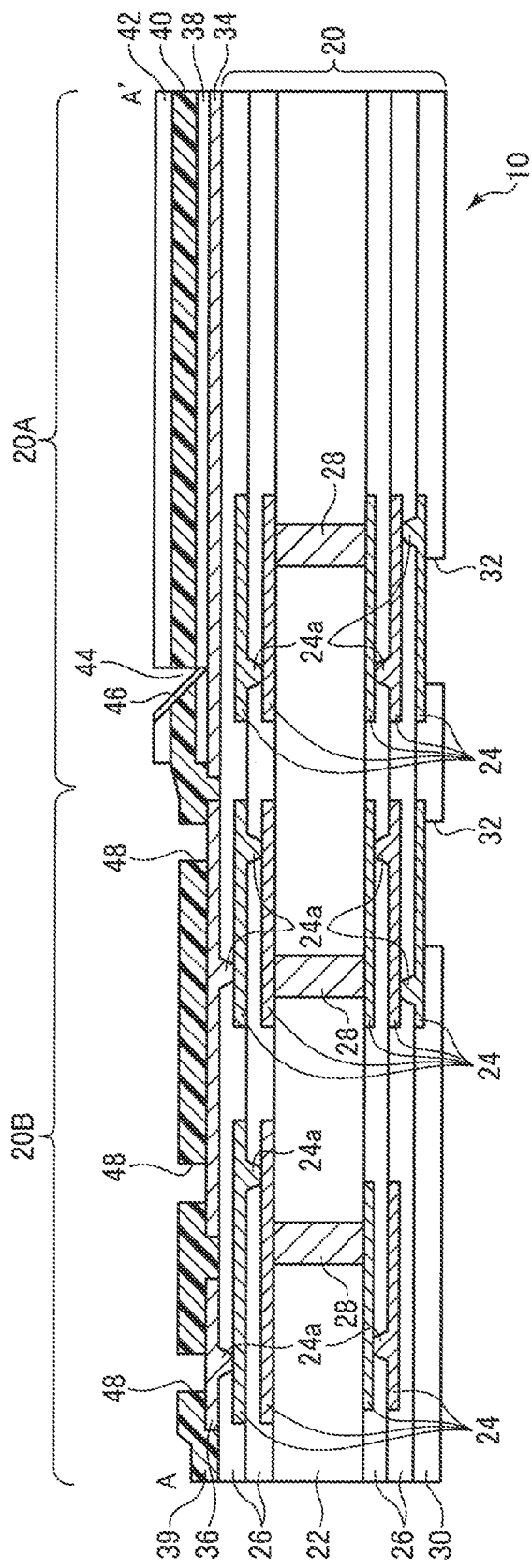
FIG. 2 is a cross-sectional view illustrating the photoelectric composite substrate according to the first embodiment.

A photoelectric composite substrate according to a first embodiment will be described with reference to FIGS. 1 and 2. FIG. 1 is a plan view illustrating the photoelectric composite substrate according to the first embodiment. FIG. 2 is an A-A' cross-sectional view illustrating the photoelectric composite substrate according to the first embodiment, taken along line A-A' in FIG. 1.

A photoelectric composite substrate 10 according to the present embodiment is used for mounting an optical component such as a light emitting device or a light receiving device, and an electronic component such as a driver, an amplifier or a control circuit, on an upper surface that is one surface thereof, as shown in FIG. 2.

As shown in FIG. 2, the photoelectric composite substrate 10 according to the present embodiment includes a wiring substrate 20 in which a plurality of wiring layers are formed. An optical waveguide is formed in a first region 20A of the wiring substrate 20, and a wiring is formed in a second region 20B thereof.

As shown in FIG. 2, the wiring substrate 20 includes a resin substrate 22 that forms a wiring substrate body. A plurality of wiring layers 24 that are respectively formed in predetermined patterns are formed on both surfaces of the resin substrate 22. An interlayer insulating film 26 is formed between the plurality of wiring layers 24. The plurality of wiring layers 24 are connected to each other by conductive vias 24a provided in via holes formed in the interlayer insulating film 26. The resin substrate 22 is provided with a through electrode 28 for connecting the wiring layers 24 formed on both surfaces thereof.

On a lower surface in FIG. 2 that is opposite to a component mounting surface of the wiring substrate 20, a solder resist layer 30 that is a protective film is formed to cover the wiring layer 24. A plurality of opening portions 32 for connection to a mother board or the like are formed in a predetermined position of the solder resist layer 30.

The resin substrate 22 has a thickness of 1.0 mm, for example, and is formed by a glass epoxy resin of FR-4 (Flame Retardant Type 4), for example.

The wiring layer 24 has a thickness of 15 µm, for example. The interlayer insulating film 26 has a thickness of 50 µm, for example. The through electrode 28 is formed of copper, for example. The solder resist layer has a thickness of 30 µm, for example.

The wiring layer 20 shown in FIG. 2 is an example, and another example may be used.

As shown in FIG. 2, the first region 20A in which the optical waveguide is formed and the second region 20B in which the wiring is formed are formed on the component mounting surface of the wiring layer 20.

A dummy wiring layer 34 is formed in the first region 20A of the wiring substrate 20, and a wiring layer 36 is formed in the second region 20B.

The wiring layer 36 formed in the second region 20B is patterned in a predetermined shape. For example, the wiring layer 36 is patterned to electrically connect the optical component such as a light emitting device or a light receiving device and the electric component such as a driver, an amplifier or a control circuit that are mounted on the photoelectric composite substrate 10.

The dummy wiring layer 34 formed in the first region 20A is provided to prevent a height difference between the first region 20A and the second region 20B in which the wiring layer 36 is formed. The planar pattern of the dummy wiring layer 34 may be a rectangular shape having one solid surface, or may be patterned in a predetermined shape.

The dummy wiring layer 34 and the wiring layer 36 have a thickness of 15 µm, for example, and are formed of copper, for example.

On the dummy wiring layer 34 formed on the first region 20A of the wiring substrate 20, a first cladding layer 38 that is a cladding layer of an optical waveguide is formed.

On an upper surface on the component mounting surface side of the wiring substrate 20, that is, on the first cladding layer 38 of the first region 20A of the wiring substrate 20, on the wiring layer 36 of the second region 20B of the wiring substrate 20, and on the wiring substrate 20, a resin layer 39 is formed. As shown in FIG. 1, the resin layer 39 is patterned in a core shape of the optical waveguide in the first region 20A, and is patterned in a rectangular shape having one solid surface in the second region 20B. The resin layer 39 in the first region 20A is formed as a core layer 40 that is a core of the optical waveguide. The resin layer 39 in the second region 20B is formed as an insulating layer.

On the core layer 40 in the first region 20A of the wiring substrate 20, a second cladding layer 42 that is a cladding layer of the optical waveguide is formed.

The first cladding layer 38 has a thickness of 10 µm, for example, and the resin layer 39 and the core layer 40 have a thickness of 40 µm, for example. The second cladding layer 42 has a thickness of 50 µm from a lower surface of the core layer 40, for example. The optical waveguide has a thickness of 60 µm, for example.

The first cladding layer 38, the resin layer 39, the core layer 40, and the second cladding layer 42 are basically formed of the same material. For example, an acrylic resin such as polymethyl methacrylate (PMMA), an epoxy resin, a polyimide resin, a silicon resin or the like may be used. The material that forms the first cladding layer 38 and the second cladding layer 42 has a low refractive index, compared with a refractive index of the material that forms the resin layer 39 and the core layer 40, so that an optical signal propagates in the core layer 40.

As shown in FIGS. 1 and 2, in a predetermined position, in the first region 20A, of the first cladding layer 38, the core layer 40 and the second cladding layer 42, a V-shaped groove 44 is formed. The V-shaped groove 44 is opened upward, and has one surface that is a reflective surface inclined at an angle of 45° with respect to a traveling direction of light that propagates in the core layer 40. A reflective film 46 is formed on the reflective surface. The position of the V-shaped groove 44 corresponds to a position that faces a light emitting surface or a light receiving surface when an optical component is mounted in the photoelectric composite substrate 10.

The reflective film 46 has a thickness of 0.2 µm, for example, and is formed of gold or silver, for example.

As shown in FIGS. 1 and 2, a plurality of openings 48 for electrical connection to the optical component or the electric component, which is to be mounted on the photoelectric composite substrate 10, are formed in the predetermined position of the second region 20B of the resin layer 39.

In the photoelectric composite substrate 10 according to the present embodiment, as shown in FIGS. 1 and 2, a case where the V-shaped groove 44a is formed in the predetermined position before shipment is shown as an example, but the groove should not necessarily be formed before shipment. The photoelectric composite substrate 10 may be shipped in a state where the V-shaped groove 44 is not formed, and then, the V-shaped groove 44 may be formed and the reflective film 46 may be formed on the inclination surface at a shipment destination or the like as necessary.

Further, the optical component or the electric component, which is to be mounted in the photoelectric composite substrate 10, is connected to a conductive part which is exposed from the opening 48 formed in the photoelectric composite substrate 10 by a soldering bump, an Au bump or the like. Thus, solder may be coated as a pre-solder in view of easy connection for the convenience of customers or the like.

<Photoelectric Composite Apparatus>

Figure 3:
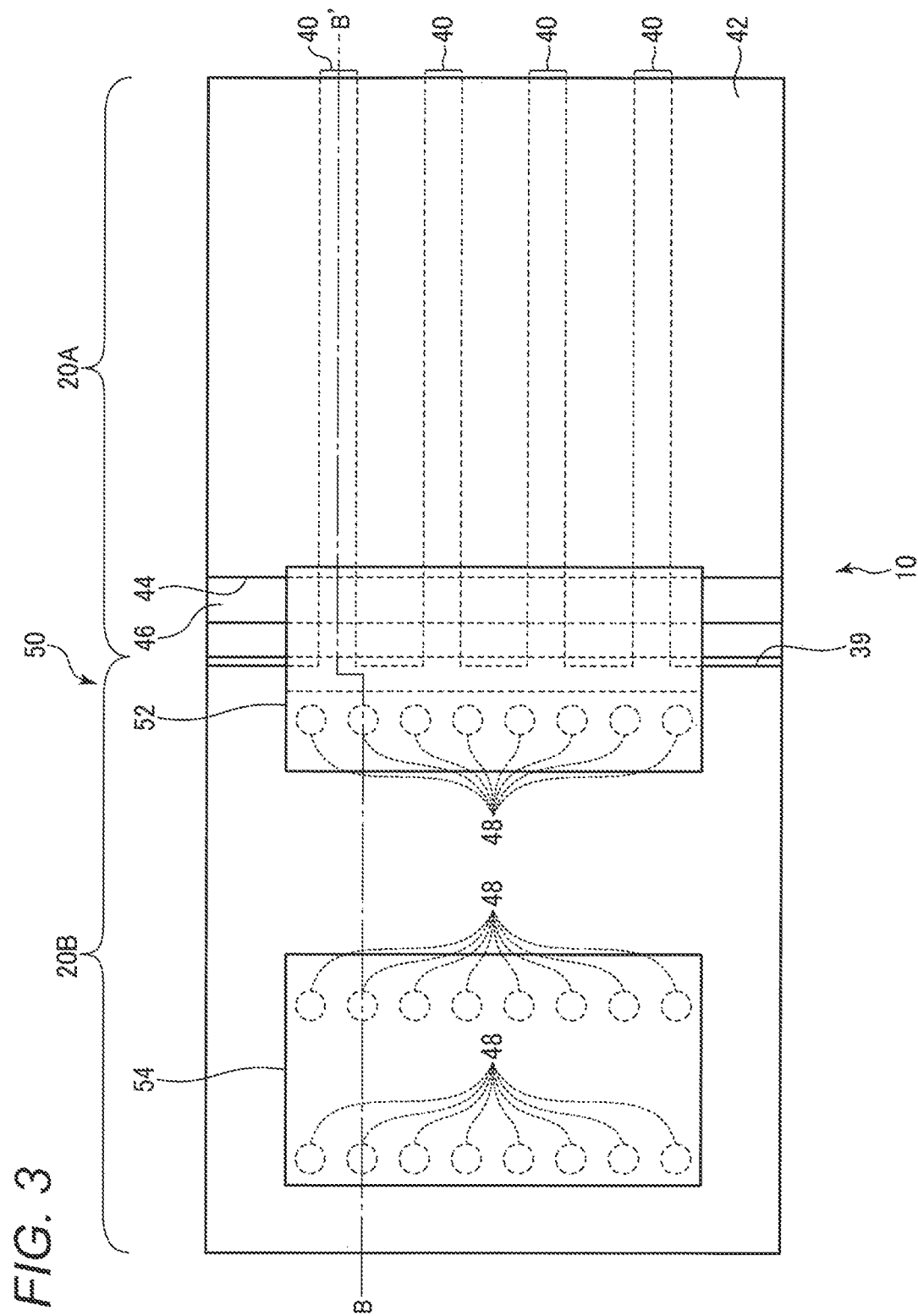
FIG. 3 is a plan view illustrating a photoelectric composite apparatus according to the first embodiment.
Figure 4:
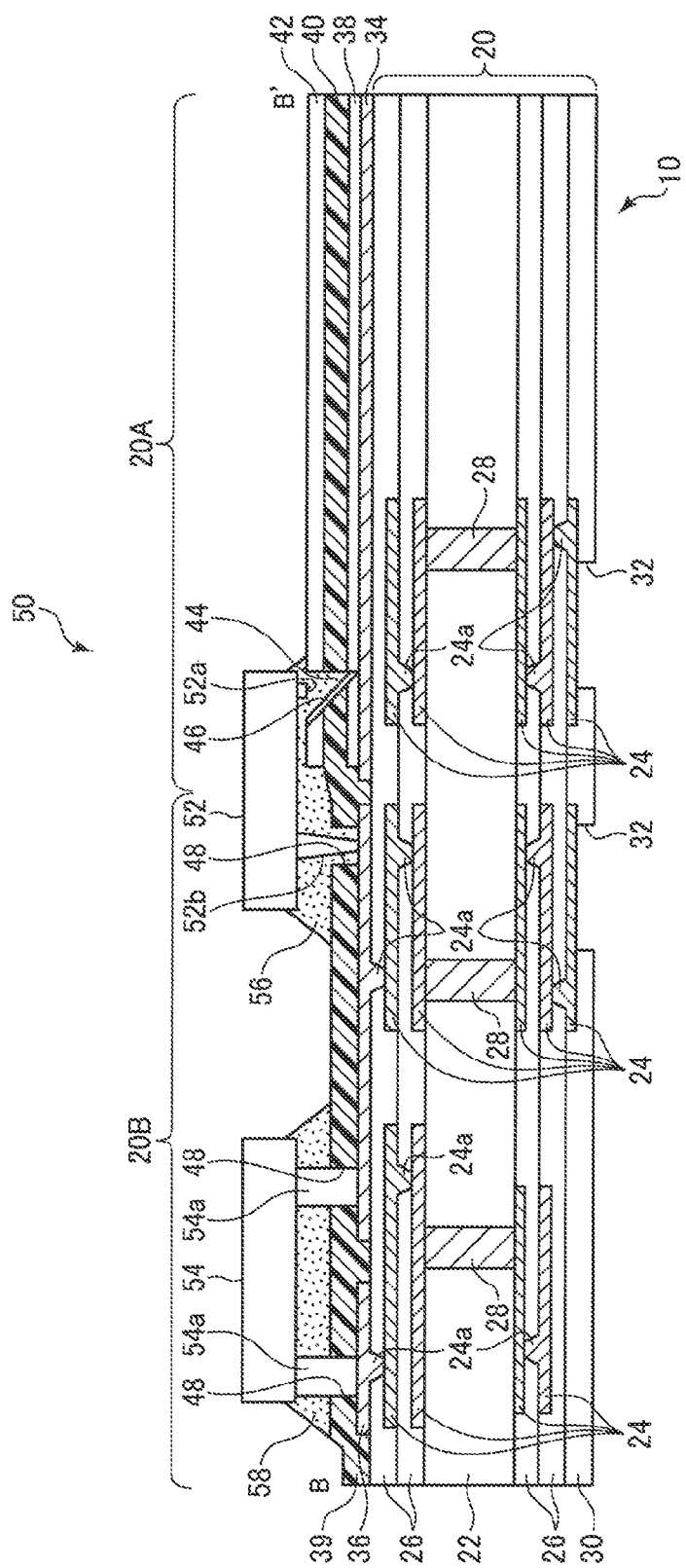
FIG. 4 is a cross-sectional view illustrating the photoelectric composite apparatus according to the first embodiment.

A photoelectric composite apparatus according to the first embodiment will be described with reference to FIGS. 3 and 4. FIG. 3 is a plan view illustrating the photoelectric composite apparatus according to the first embodiment. FIG. 4 is a B-B' cross-sectional view illustrating the photoelectric composite apparatus according to the first embodiment, which is taken along line B-B' in FIG. 3.

In a photoelectric composite apparatus 50 according to the present embodiment, an optical component such as a light emitting device or a light receiving device and an electric component such as a driver, an amplifier or a control circuit are surface-mounted on an upper surface in FIG. 4 that is the component mounting surface of the photoelectric composite substrate 10.

As shown in FIGS. 3 and 4, an optical component 52 is mounted in a boundary between the first region 20A and the second region 20B of the photoelectric composite substrate. An electric component 54 is mounted in the second region 20B of the photoelectric composite substrate.

As the optical component 52 to be mounted, for example, a light emitting device such as a VCSEL (vertical cavity surface emitting laser) or an LED (light emitting diode), a light receiving device such as a PD (photo diode) or an APD (avalanche photo diode), or the like may be used.

As the electric component 54 to be mounted, an IC chip such as a driver that drives the light emitting device that is the optical component 52, an IC chip in which a DSP that processes an optical output signal from the light receiving device, an amplifier and the like are assembled may be used.

The optical component 52 includes a light input/output portion 52a that receives or emits light and an Au bump 52b that is an electrode, on a surface thereof that faces the photoelectric composite substrate 10. The light input/output portion 52a of the optical component 52 is optically coupled to face the reflective film 46 of the V-shaped groove 44, and the Au bump 52b is electrically connected to the wiring layer 36 exposed through the opening 48. An under filling resin 56 is filled between the optical component 52 and the core layer 40.

The electric component 54 includes a bump 54a that is an electrode pad, on a surface thereof that faces the photoelectric composite substrate 10. The bump 54a of the electric component 54 is electrically connected to the wiring layer 36 exposed through the opening 48. An under filling resin 58 is filled between the electric component 54 and the resin layer 39.

On right end parts of the photoelectric composite apparatus 50 in FIGS. 3 and 4, an optical connector (not shown) for input and output of an optical signal is installed.

As described above, according to the present embodiment, it is possible to set the position of the opening portion for mounting the optical component, the electric component or the like with high accuracy.

<Method of Manufacturing Photoelectric Composite Substrate and Photoelectric Component Apparatus>

A method of manufacturing the photoelectric composite substrate and the photoelectric component apparatus according to the first embodiment will be described with reference to FIGS. 5A and 5B to FIGS. 11A and 11B. FIGS. 5A and 5B to FIGS. 10A and 10B are process cross-sectional views illustrating the method of manufacturing the photoelectric composite substrate and the photoelectric component apparatus according to the first embodiment. FIGS. 11A and 11B are process cross-sectional views illustrating the method of manufacturing the photoelectric composite apparatus according to the first embodiment. The process cross-sectional views of FIGS. 5A and 5B to FIGS. 10A and 10B correspond to cross-sectional views, taken along line A-A' in FIG. 2, and the process cross-sectional views of FIGS. 11A and 11B correspond to cross-sectional views, taken along line B-B' in FIG. 3.

First, the wiring substrate 20 is manufactured by a conventional manufacturing method (see FIG. 5A). The through hole 28 for connecting the wiring layer 24 to the resin substrate 22 that forms the wiring substrate body is formed. The plurality of wiring layers 24 that are formed in the predetermined patterns and the interlayer insulating films 26 are sequentially formed on the both surfaces of the resin substrate 22. The wiring layers 24 are connected to each other by the conductive vias 24a formed in the interlayer insulating film 26. On the surface of the wiring substrate 20 opposite to the component mounting surface side thereof, the solder resist layer 30 that is the protective film is formed to cover the wiring layer 24. The opening portions 32 for connection to the wiring layer 24 are formed in the solder resist layer 30.

Next, via holes 26a that reach the wiring layers 24 are formed in the interlayer insulating film 26 on the component mounting surface side of the wiring substrate 20 (see FIG. 5B). On the component mounting surface side of the wiring substrate 20, the first region 20A in which the optical waveguide is formed and the second region 20B in which the wiring is formed are formed. The via holes 26a are formed in the second region 20B in which the wiring layer is formed, and are not formed in the first region 20A in which the optical waveguide is formed.

Then, the conductive layer 33 is formed on the upper surface of the interlayer insulating film 26 on the component mounting surface side of the wiring substrate 20 (see FIG. 6A). The conductive layer 33 has a thickness of 15 μm, for example, and is formed of copper, for example.

Next, the conductive layer 33 is patterned to form the dummy wiring layer 34 in the first region 20A of the wiring substrate 20 and to form the wiring layer 36 in the second region 20B (see FIG. 6B). The wiring layer 36 formed in the second region 20B is patterned in a predetermined shape. The dummy wiring layer 34 formed in the first region 20A is provided to prevent a height difference between the first region 20A and the second region 20B in which the wiring layer 36 is formed. The planar pattern of the dummy wiring layer 34 may be a rectangular shape having one solid surface, or may be patterned in a predetermined shape.

Next, the resin layer 37 that forms the first cladding layer is formed on the upper surface including the dummy wiring layer 34 and the wiring layer 36 on the component mounting surface side of the wiring substrate 20 (see FIG. 7A). The resin layer 37 has a thickness of 10 μm, for example, and an acrylic resin such as polymethyl methacrylate (PMMA), an epoxy resin, a polyimide resin, a silicone resin or the like may be used.

As a method of forming the resin layer 37, for example, a method of coating a resin by a spin coating method or a method of attaching a resin film may be used.

Since the dummy wiring layer 34 is also formed in the first region 20A and there is no step caused by a height difference between the first region 20A and the second region 20B where the wiring layer 36 is formed, it is possible to uniformly attach a laminate film on the upper surface.

Next, the resin layer 37 is patterned to form the first cladding layer 38 in the first region 20A of the wiring substrate 20 (see FIG. 7B). The first cladding layer 38 has a thickness of 10 µm, for example.

Then, on an upper surface including the upper surfaces of the first cladding layer 38 and the wiring layer 36 on the component mounting surface side of the wiring substrate 20, the resin layer 39 that corresponds to a core layer and an insulating layer is formed (FIG. 8A). The resin layer 39 has a thickness of 40 µm, for example, and includes an acrylic resin such as polymethyl methacrylate (PMMA), an epoxy resin, a polyimide resin, a silicone resin or the like.

As a method of forming the resin layer 39, for example, a method of coating a resin by a spin coating method or a method of attaching a resin laminate film may be used.

Since a step caused by the height difference between the first region 20A and the second region 20B is small, it is possible to uniformly attach the laminate film on the upper surface.

Figure 14:
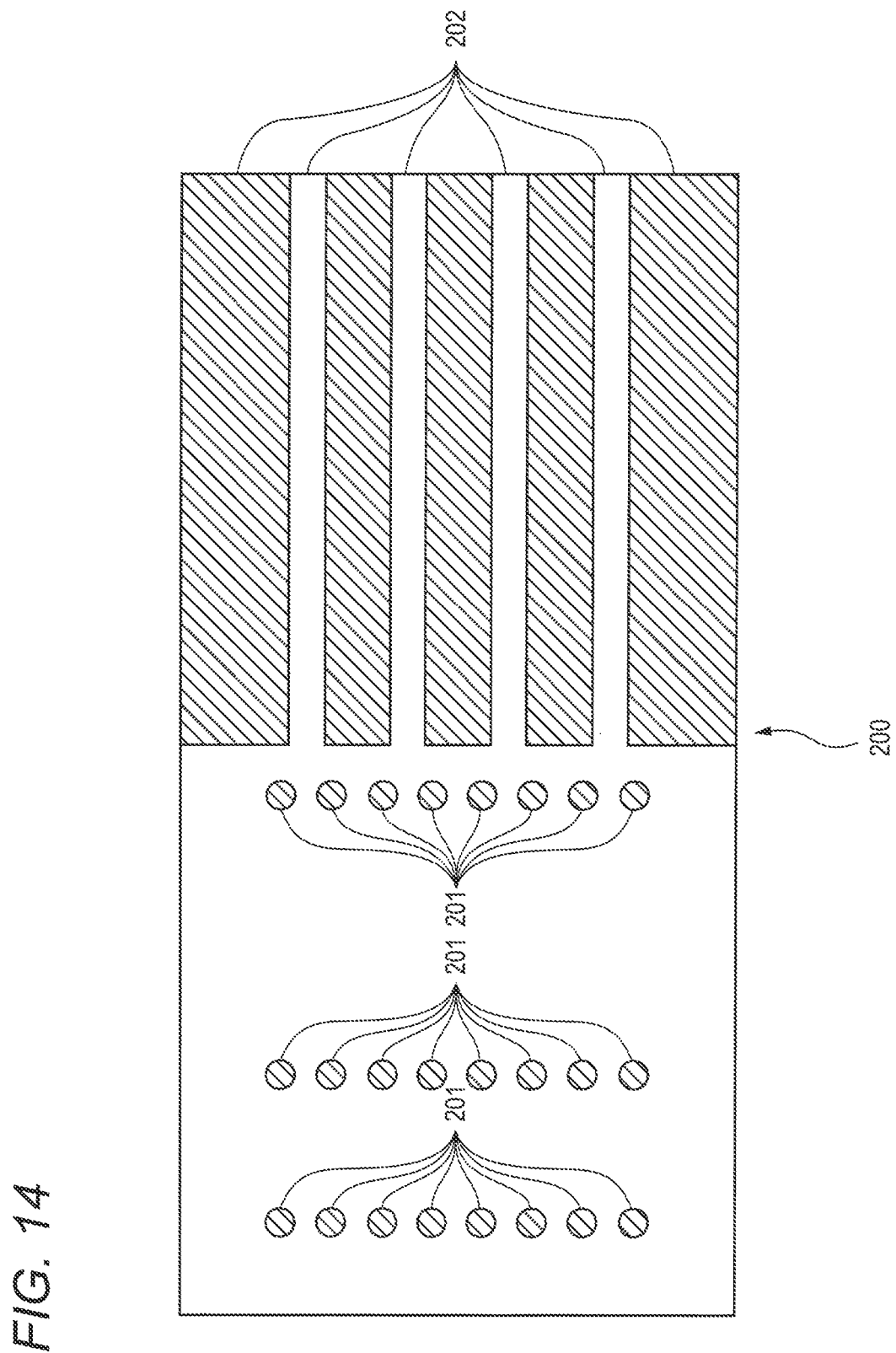
FIG. 14 is a schematic view illustrating a mask 200 used for patterning a resin layer 39 to form a core layer 40 and an opening 48.

Then, the resin layer 39 is patterned to form the core layer 40 of the optical waveguide in the first region 20A of the wiring substrate 20 and to form the resin layer 39 that has one solid rectangular shape in the second region 20B of the wiring substrate 20 and serves as the insulating layer having the opening 48 through which the wiring layer 36 is exposed (see FIG. 8B). For example, the resin layer 39 may be patterned using a mask 200 shown in FIG. 14 to form the core layer 40 and the opening 48 at the same time. As shown in FIG. 14, each mask pattern 201 on the mask 200 corresponds to the opening 48 and each region between mask patterns 202 on the mask 200 corresponds to the core layer 40. In patterning the resin layer 39, the mask 200 is disposed above the resin layer 39 and the resin layer 39 is irradiated with exposure light through the mask 200 having the mask patterns 201 and 202. Then, through the development, the core layer 40 and the opening 48 are formed at the same time. The resin layer 39 may be formed of light curing resin.

The resin layer 39 in the second region 20B of the wiring substrate 20 functions as a protective layer that protects the wiring layer 36. The optical component and the electric component to be mounted are electrically connected to the wiring layer 36 exposed through the openings 48 of the resin layer 39.

Since the resin layer 39 is patterned to form the core layer 40 in the first region 20A and to form the opening 48 in the resin layer 39 of the second region 20B, it is possible to form the core layer 40 and the opening 48 of the resin layer 39 with high accuracy.

Next, on an upper surface including the upper surfaces of the resin layer 39 and the core layer 40 on the component mounting surface side of the wiring substrate 20, the resin layer 41 that corresponds to the second cladding layer is formed (FIG. 9A). The resin layer 41 has a thickness of 50 µm, for example, and includes an acrylic resin such as polymethyl methacrylate (PMMA), an epoxy resin, a polyimide resin, a silicone resin or the like.

As a method of forming the resin layer 41, for example, a method of coating a resin by a spin coating method or a method of attaching a resin laminate film may be used.

Since a step due to the height difference between the first region 20A and the second region 20B is small, it is possible to uniformly attach the laminate film on the upper surface.

Then, the resin layer 41 is patterned to form the second cladding layer 42 in the first region 20A of the wiring substrate 20 (see FIG. 9B).

The material that forms the first cladding layer 38 and the second cladding layer 42 has a low refractive index, compared with a refractive index of the material that forms the core layer 40, so that an optical signal propagates in the core layer 40.

Next, in a predetermined position of the first cladding layer 38, the core layer 40 and the second cladding layer 42, the groove 44 is substantially formed in V-shape (see FIG. 10A). The position of the V-shaped groove 44 corresponds to a position that faces a light emitting surface or a light receiving surface thereof when the optical component is mounted on the photoelectric composite substrate 10. The V-shaped groove 44 is opened upward, and has one surface that is inclined at an angle of 45° with respect to a traveling direction of light that propagates in the core layer 40.

As a method of forming the V-shaped groove 44 in the first cladding layer 38, the core layer 40 and the second cladding layer 42, for example, machining using a diamond saw having a V-shaped tip end or cutlery, laser ablation or the like may be used.

Then, the reflective film 46 is formed on the reflective surface of the V-shaped groove 44 (see FIG. 10B). The reflective film 46 has a thickness of 0.2 µm, for example, and may be formed of a lustrous metal such as Au or Ag.

As a method of forming the reflective film 46, for example, a region other than the reflective surface of the V-shaped groove 44 is masked and the lustrous metal film such as Au or Ag is coated by sputtering, deposition or the like.

The photoelectric composite substrate 10 according to the present embodiment is completed through the above-mentioned processes.

In the above-mentioned embodiment, a case where the V-shaped groove 44 is formed in the predetermined position before shipment is shown as an example, but the groove should not necessarily be formed before shipment. The photoelectric composite substrate 10 may be shipped in a state where the V-shaped groove 44 is not formed, and then, the V-shaped groove 44 may be formed and the reflective film 46 may be formed on the inclination surface at a shipment destination or the like as necessary.

Further, the electrode pad of the optical component or the electric component mounted in the photoelectric composite substrate 10 is connected to the conductive part which is exposed through the opening 48 formed in the photoelectric composite substrate 10 by a soldering bump, a Au bump or the like. Thus, solder may be coated as a pre-solder or the like in view of easy connection for the convenience of customers or the like.

The optical component and the electric component are mounted on the photoelectric composite substrate 10 completed by the above-mentioned processes to manufacture the photoelectric composite apparatus 50.

As the optical component 52 to be mounted, for example, a light emitting device such as a VCSEL (vertical cavity surface emitting laser) or an LED (light emitting diode), a light receiving device such as a PD (photo diode) or an APD (avalanche photo diode), or the like may be used. The optical component 52 includes the light input/output portion 52a that receives or emits light and the Au bump 52b that is an electrode pad.

As the electric component 54 to be mounted, an IC chip such as a driver that drives the light emitting device that is the optical component 52, an IC chip in which a DSP that processes an optical output signal from the light receiving device, an amplifier and the like are assembled may be used. The electric component 54 includes the bump 54a that is an electrode.

Next, a method of manufacturing the photoelectric component apparatus according to the present embodiment will be described with reference to FIGS. 11A and 11B.

First, the optical component 52 and the electric component 54 are mounted in predetermined positions of the photoelectric component substrate 10 (see FIG. 11A). The optical component 52 is mounted so that the light input/output portion 52a faces the reflective film 46 of the V-shaped groove 44 and the Au bump 52b is electrically connected to the wiring layer 36 exposed through the opening 48, and the electric component 54 is mounted so that the bump 54a that is the electrode is electrically connected to the wiring layer 36 exposed through the opening 48.

Then, the under filling resin 56 is filled between the optical component 52 and the core layer 40, and the under filling resin 58 is filled between the electric component 54 and the resin layer 39 (see FIG. 11B).

The photoelectric composite apparatus 50 according to the present embodiment is completed through the above-mentioned processes.

As described above, according to the present embodiment, the resin layer is patterned to form the core layer and to form the opening in the resin layer at the same time. Thus, it is possible to form the core layer and the opening of the resin layer with high accuracy.

Second Embodiment

<Photoelectric Composite Substrate>

Figure 12:
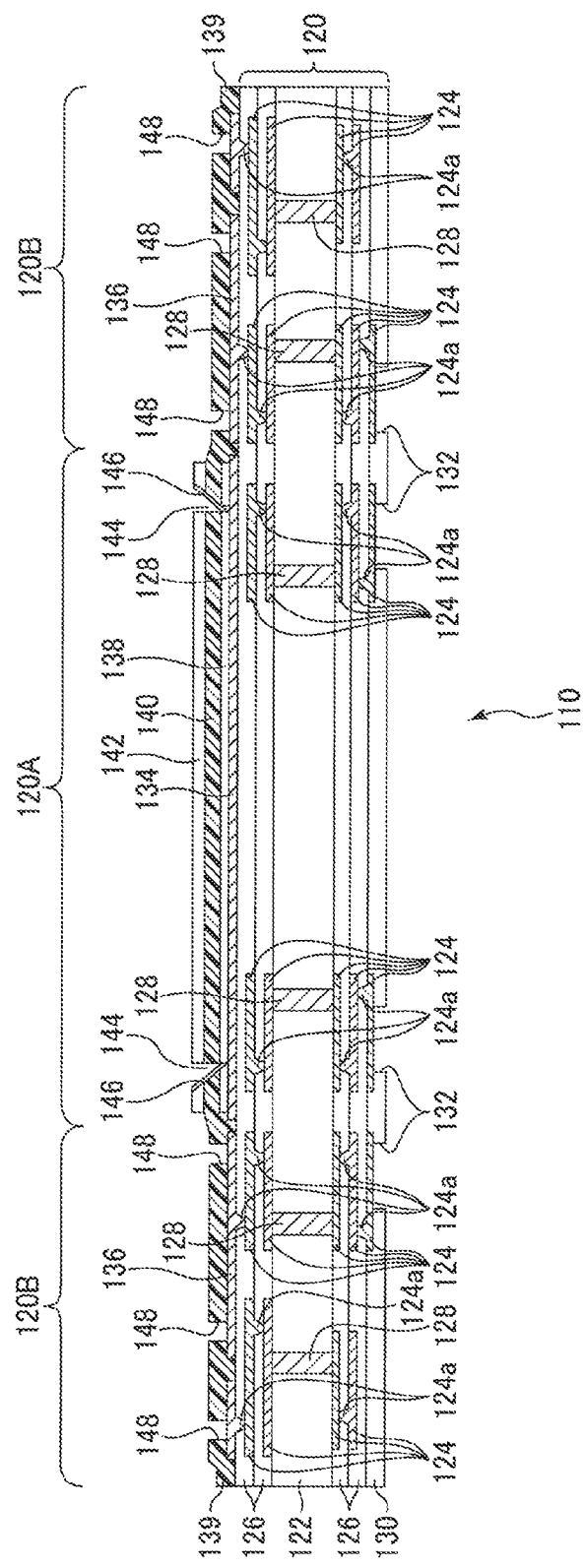
FIG. 12 is a cross-sectional view illustrating a photoelectric composite substrate according to a second embodiment.

A photoelectric composite substrate according to a second embodiment will be described with reference to FIG. 12. FIG. 12 is a cross-sectional view illustrating the photoelectric composite substrate according to the second embodiment.

A photoelectric composite substrate 110 according to the present embodiment is used for surface-mounting an optical component such as a light emitting device or a light receiving device, and an electronic component such as a driver, an amplifier or a control circuit, on an upper surface that is one surface thereof.

As shown in FIG. 12, the photoelectric composite substrate 110 according to the present embodiment includes a wiring substrate 120 in which a plurality of wiring layers are formed. An optical waveguide is formed in a first region 120A of the wiring substrate 120, and a wiring is formed in a second region 120B provided on the opposite sides of the first region 120A.

As shown in FIG. 12, the wiring substrate 120 includes a resin substrate 122 that forms a wiring substrate body. A plurality of wiring layers 124 that are respectively patterned in predetermined forms are formed on both surfaces of the resin substrate 122. An interlayer insulating film 126 is formed between the plurality of wiring layers 124. The plurality of wiring layers 124 are connected to each other by conductive vias 124a formed in the interlayer insulating film 126. The resin substrate 122 is provided with a through electrode 128 for connecting the wiring layers 124 formed on the both surfaces thereof.

On a lower surface in FIG. 12 that is a surface opposite to a component mounting surface of the wiring substrate 120, a solder resist layer 130 that is a protective film is formed to cover the wiring layer 124. An opening portion 132 for connection to the wiring layer 124 is formed in the solder resist layer 130.

The wiring layer 120 shown in FIG. 12 is an example, and another example may be used.

As shown in FIG. 12, the first region 120A in which the optical waveguide is formed on the component mounting surface of the wiring layer 120 and the second regions 120B in which the wiring is formed are formed on both sides of the first region 120A.

A dummy wiring layer 134 is formed in the first region 120A of the wiring substrate 120, and a wiring layer 136 is formed in the second region 120B.

The wiring layer 136 formed in the second region 120B is patterned in a predetermined shape. For example, the wiring layer 136 is patterned to electrically connect the optical component such as a light emitting device or a light receiving device and the electric component such as a driver, an amplifier or a control circuit that are mounted on the photoelectric composite substrate 110.

The dummy wiring layer 134 formed in the first region 120A is provided to prevent a height difference between the first region 120A and the second regions 120B in which the wiring layer 136 is formed. The planar pattern of the dummy wiring layer 134 may be a shape having one solid surface, or may be patterned in a predetermined shape.

On an upper surface on the component mounting surface side of the wiring substrate 120, that is, on the first cladding layer 138 of the first region 120A of the wiring substrate 120, on the wiring layers 136 of the second regions 120B of the wiring substrate 120, and on the wiring substrate 120, a resin layer 139 is formed. The resin layer 139 in the first region 120A is formed as a core layer 140 that is a core of the optical waveguide. The resin layer 139 in each second region 120B is formed as an insulating layer.

As shown in FIG. 12, the resin layer 139 is patterned in a core shape of the optical waveguide in the first region 120A, and is patterned in a rectangular shape having one solid surface in the second region 120B.

On the core layer 140 in the first region 120A of the wiring substrate 120, a second cladding layer 142 that is a cladding layer of the optical waveguide is formed.

The first cladding layer 138, the resin layer 139, the core layer 140 and the second cladding layer 142 are basically formed of the same material, for example, an acrylic resin such as polymethyl methacrylate (PMMA), an epoxy resin, a polyimide resin, a silicone resin or the like. The material that forms the first cladding layer 138 and the second cladding layer 142 has a low refractive index, compared with a refractive index of the material that forms the resin layer 139 and the core layer 140, so that an optical signal propagates in the core layer 140.

As shown in FIG. 12, in the vicinity of the both ends of the first region 120A, of the first cladding layer 138, the core layer 140 and the second cladding layer 142, a V-shaped groove 144 is formed. The V-shaped groove 144 is opened upward, and has a reflective surface inclined at an angle of 45° with respect to a traveling direction of light that propagates in the core layer 140. A reflective film 146 is formed on the reflective surface. The position of the V-shaped groove 144 corresponds to a position that faces a light emitting surface or a light receiving surface when an optical component is mounted in the photoelectric composite substrate 110.

As shown in FIG. 12, in the predetermined position of the second region 120B of the core layer 140, a plurality of openings 148 for electrical connection to the optical component and the electric component mounted in the photoelectric composite substrate 110 are formed.

In the photoelectric composite substrate 110 according to the present embodiment, as shown in FIG. 12, a case where the V-shaped groove 144 is formed in the predetermined position before shipment is shown as an example, but the groove should not necessarily be formed before shipment. The photoelectric composite substrate 110 may be shipped in a state where the V-shaped groove 144 is not formed, and then, the V-shaped groove 144 may be formed and the reflective film 146 may be formed on the inclination surface at a shipment destination or the like as necessary.

Further, the optical component or the electric component mounted in the photoelectric composite substrate 110 is connected to a conductive part which is exposed through the opening 148 formed in the photoelectric composite substrate 110 by a soldering bump, an Au bump or the like. Thus, solder may be coated as a pre-solder or the like in view of easy connection for the convenience of customers or the like.

<Photoelectric Composite Apparatus>

Figure 13:
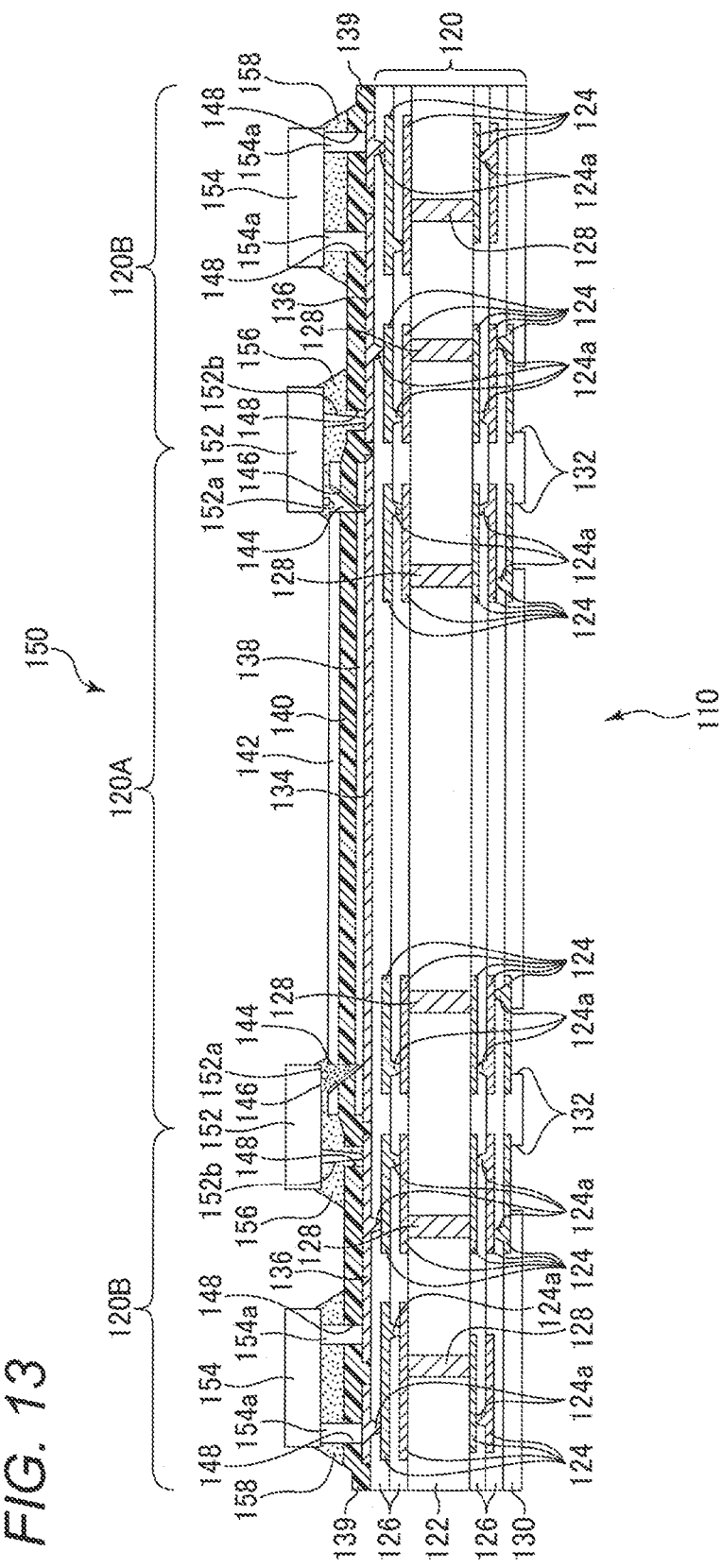
FIG. 13 is a cross-sectional view illustrating a photoelectric composite apparatus according to the second embodiment.

A photoelectric composite apparatus according to the second embodiment will be described with reference to FIG. 13. FIG. 13 is a cross-sectional view illustrating the photoelectric composite apparatus according to the second embodiment.

A photoelectric composite apparatus 150 according to the present embodiment is an apparatus in which an optical component such as a light emitting device or a light receiving device and an electric component such as a driver, an amplifier or a control circuit are surface-mounted on an upper surface in FIG. 13 that is a component mounting surface of the photoelectric composite substrate 110.

As shown in FIG. 13, an optical component 152 is mounted in a boundary between the first region 120A and each second region 120B of the photoelectric composite substrate. An electric component 154 is mounted in each second region 120B of the photoelectric composite substrate.

As the optical component 152 to be mounted, for example, a light emitting device such as a VCSEL (vertical cavity surface emitting laser) or an LED (light emitting diode), a light receiving device such as a PD (photo diode) or an APD (avalanche photo diode), or the like may be used.

As the electric component 154 to be mounted, an IC chip such as a driver that drives the light emitting device that is the optical component 52, an IC chip in which a DSP that processes an optical output signal from the light receiving device, an amplifier and the like are assembled may be used.

In the photoelectric composite apparatus 150 according to the present embodiment, for example, one optical component 152 of the core layer 140 may be used as a light emitting component, and the other optical component 152 may be used as a light receiving component.

The optical component 152 includes a light input/output portion 152a that receives or emits light and an Au bump 152b that is an electrode pad, on a surface thereof that faces the photoelectric composite substrate 110. The light input/output portion 152a of the optical component 152 is optically coupled to face the reflective film 146 of the V-shaped groove 144, and the Au bump 152b is electrically connected to the wiring layer 136 exposed through the opening 148. An under filling resin 156 is filled between the optical component 152 and the core layer 140.

The electric component 154 includes a bump 154a that is an electrode on a surface thereof that faces the photoelectric composite substrate 110. The bump 154a of the electric component 154 is electrically connected to the wiring layer 136 exposed through the opening 148. An under filling resin 158 is filled between the electric component 154 and the core layer 140.

As described above, according to the present embodiment, it is possible to set the position of the opening portion or the like for mounting the optical component, the electric component or the like, with high accuracy.

The above-described embodiments are only examples, and various modifications may be used as necessary.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A photoelectric composite substrate comprising:
a wiring substrate comprising a first region and a second region;
an optical waveguide disposed on the first region of the wiring substrate and comprising:
a first cladding layer on the wiring substrate;
a core layer on the first cladding layer; and
a second cladding layer on the core layer;
a wiring layer on the second region of the wiring substrate; and
an insulating layer having an opening portion on the wiring layer such that the wiring layer is exposed through the opening portion, wherein the insulating layer is made of the same material as that of the core layer, and at least a part of the insulating layer is formed directly on the wiring layer.

2. The substrate according to claim 1, further comprising:
a dummy wiring layer on the first region of the wiring substrate,
wherein the first cladding layer is formed on the wiring substrate via the dummy wiring layer.

3. The substrate according to claim 1, wherein a groove which is substantially formed in V-shape is formed in a certain position of the first cladding layer, the core layer and the second cladding layer.

4. The substrate according to claim 1, wherein the insulating layer is continuously formed with the core layer.

5. A photoelectric composite apparatus comprising:
the photoelectric composite substrate according to claim 1;
an optical component on the photoelectric composite substrate and optically coupled to the optical waveguide; and
an electronic component on the photoelectric composite substrate and electrically connected to the wiring layer.

6. The substrate according to claim 1, wherein
a groove having a substantially V shape is formed in a certain position of the first cladding layer, the core layer and the second cladding layer, and
a reflection film is formed in the groove so that when light propagates through the optical waveguide and is incident on the reflection film, the reflection film reflects the incident light toward an opposite side to the wiring layer.

7. A method of manufacturing a photoelectric composite apparatus, the method comprising:
forming a photoelectric composite substrate comprising: a wiring substrate comprising a first region and a second region; an optical waveguide disposed on the first region of the wiring substrate and comprising: a first cladding layer on the wiring substrate; a core layer on the first cladding layer; and a second cladding layer on the core layer; a wiring layer on the second region of the wiring substrate; and an insulating layer having an opening portion on the wiring layer such that the wiring layer is exposed through the opening portion, wherein the insulating layer is made of the same material as that of the core layer, and at least a part of the insulating layer is formed directly on the wiring layer;

mounting an optical component on the photoelectric composite substrate such that the optical component is optically coupled to the optical waveguide; and mounting an electronic component on the photoelectric composite substrate such that the electronic component is electrically connected to the wiring layer.

8. The method of claim 7, wherein forming the photoelectric composite substrate further includes forming the photoelectric composite substrate to include a groove having a substantially V shape formed in a certain position of the first cladding layer, the core layer and the second cladding layer, and a reflection film formed in the groove so that when light propagates through the optical waveguide and is incident on the reflection film, the reflection film reflects the incident light toward an opposite side to the wiring layer.

9. A method of manufacturing a photoelectric composite substrate, the method comprising:

(a) providing a wiring substrate comprising a first region and a second region;

(b) forming a wiring layer on the second region of the wiring substrate;

(c) forming a first cladding layer on the first region of the wiring substrate;

(d) forming a core layer on the first cladding layer while forming an insulating layer, having an opening portion, directly on the wiring layer such that the wiring layer is exposed through the opening portion, wherein the insulating layer is made of the same material as that of the core layer; and (e) forming a second cladding layer on the core layer.

10. The method of claim 9, further comprising:

(f) forming a groove which is substantially formed in V-shaped in a certain position of the first cladding layer, the core layer and the second cladding layer.

11. The method of claim 9, wherein step (d) comprises:

forming a resin layer on the wiring layer and the first cladding layer so as to extend from the wiring layer to the first cladding layer, wherein the resin layer is made of the same material as those of the core layer and the insulating layer; and patterning the resin layer to form the core layer on the first cladding layer and to form the insulating layer having the opening portion on the wiring layer at the same time.

12. The method of claim 11, wherein the resin layer is patterned using a mask having a certain pattern to form the core layer on the first cladding layer and to form the insulating layer having the opening portion on the wiring layer at the same time.

13. The method of claim 9, wherein step (b) comprises: forming the wiring layer on the second region of the wiring substrate while forming a dummy layer on the first region of the wiring substrate, wherein step (c) comprises forming the first cladding layer on the first region of the wiring substrate via the dummy layer.

14. The method of claim 9, further comprising:

(f) forming a groove having a substantially V shape in a certain position of the first cladding layer, the core layer and the second cladding layer; and (g) forming a reflecting film in the groove so that when light propagates through the optical waveguide and is incident on the reflection film, the reflection film reflects the incident light toward an opposite side to the wiring layer.

15. A method of manufacturing a photoelectric composite apparatus, the method comprising:

(a) forming a photoelectric composite substrate by:

providing a wiring substrate comprising a first region and a second region;

forming a wiring layer on the second region of the wiring substrate;

forming a first cladding layer on the first region of the wiring substrate;

forming a core layer on the first cladding layer while forming an insulating layer, having an opening portion, directly on the wiring layer such that the wiring layer is exposed through the opening portion, wherein the insulating layer is made of the same material as that of the core layer; and forming a second cladding layer on the core layer, thereby forming an optical waveguide comprising the first cladding layer, the core layer and the second cladding layer;

(b) mounting an optical component on the photoelectric composite substrate such that the optical component is optically coupled to the optical waveguide; and (c) mounting an electronic component on the photoelectric composite substrate such that the electronic component is electrically connected to the wiring layer.

16. The method of claim 15, wherein forming the photoelectric composite substrate further comprises:

forming a groove having a substantially V shape in a certain position of the first cladding layer, the core layer and the second cladding layer; and forming a reflecting film in the groove so that when light propagates through the optical waveguide and is incident on the reflection film, the reflection film reflects the incident light toward an opposite side to the wiring layer.

* * * * *